United States Patent
Kusumoto et al.

(10) Patent No.: US 7,217,954 B2
(45) Date of Patent: May 15, 2007

(54) SILICON CARBIDE SEMICONDUCTOR DEVICE AND METHOD FOR FABRICATING THE SAME

(75) Inventors: Osamu Kusumoto, Nara (JP); Makoto Kitabatake, Nara (JP); Kunimasa Takahashi, Osaka (JP); Kenya Yamashita, Osaka (JP); Ryoko Miyanaga, Nara (JP); Masao Uchida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 10/801,606

(22) Filed: Mar. 17, 2004

(65) Prior Publication Data

US 2004/0183080 A1    Sep. 23, 2004

(30) Foreign Application Priority Data

Mar. 18, 2003  (JP)  ............ 2003-073835

(51) Int. Cl.
*H01L 31/0312* (2006.01)
*H01L 29/76* (2006.01)
*H01L 29/94* (2006.01)
*H01L 31/062* (2006.01)

(52) U.S. Cl. .................. 257/77; 257/328; 257/335; 257/339

(58) Field of Classification Search .......... 257/335, 257/339, 341, 77, 328–329
See application file for complete search history.

(56) References Cited

U.S. PATENT DOCUMENTS

| 5,029,324 | A | * | 7/1991 | Osawa et al. ............ 257/646 |
| 5,597,744 | A | * | 1/1997 | Kamiyama et al. ......... 438/285 |
| 6,025,634 | A | * | 2/2000 | Teong .................. 257/383 |
| 6,060,765 | A | * | 5/2000 | Maeda .................. 257/635 |

(Continued)

FOREIGN PATENT DOCUMENTS

JP    10-125620    5/1998

(Continued)

OTHER PUBLICATIONS

Toshiyuki Ohno, "Recent Progress in SiC-Based Device Processing", Journal of Institute of Electronics, Information and Communication Engineers, pp. 128-133, vol. J81-C-II, No. 1, Jan. 1998, Japan.

*Primary Examiner*—Shouxiang Hu
(74) *Attorney, Agent, or Firm*—McDermott Will & Emery LLP

(57) ABSTRACT

An inventive semiconductor device is provided with: a silicon carbide substrate 1; an n-type high resistance layer 2; well regions 3 provided in a surface region of the high resistance layer 2; a $p^+$ contact region 4 provided within each well region 3; a source region 5 provided to laterally surround the $p^+$ contact region 4 within each well region 3; first source electrodes 8 provided on the source regions 5 and made of nickel; second source electrodes 9 that cover the first source electrodes 8 and that are made of aluminum; a gate insulating film 6 provided on a portion of the high resistance layer 2 sandwiched between the two well regions 3; a gate electrode 10 made of aluminum; and an interlayer dielectric film 11 that covers the second source electrodes 9 and the gate electrode 10 and that is made of silicon oxide.

14 Claims, 9 Drawing Sheets

U.S. PATENT DOCUMENTS

| | | | |
|---|---|---|---|
| 6,887,747 B2* | 5/2005 | Yagishita et al. | 438/197 |
| 2003/0020136 A1* | 1/2003 | Kitabatake et al. | 257/502 |
| 2004/0036113 A1* | 2/2004 | Ueno | 257/329 |
| 2004/0119076 A1* | 6/2004 | Ryu | 257/77 |

FOREIGN PATENT DOCUMENTS

| | | |
|---|---|---|
| JP | 11-297712 | 10/1999 |
| JP | P2002-93742 A | 3/2002 |

\* cited by examiner

SILICON CARBIDE SEMICONDUCTOR DEVICE AND METHOD FOR FABRICATING THE SAME

BACKGROUND OF THE INVENTION

The present invention relates to a semiconductor device that uses a silicon carbide semiconductor substrate and a method for fabricating the device, and more particularly relates to a silicon carbide semiconductor power device handling high currents and voltages and a method for fabricating the device.

A power device is expected to be capable of handling high currents and voltages and low power loss. Although a power device that uses silicon (Si) semiconductor has conventionally been predominant, a power device that uses silicon carbide (SiC) semiconductor is recently getting attention and being developed. Since the dielectric breakdown field of silicon carbide semiconductor is ten times greater than that of silicon, the device that uses silicon carbide semiconductor has high reverse blocking voltage even if a depletion layer at a pn junction or a Schottky junction is thinned. Therefore, the thickness of the resulting device can be reduced, and dopant concentration can be increased. Accordingly, silicon carbide is highly expected as a material for a power device that has high reverse blocking voltage and a low power loss.

FIG. 9 is a cross-sectional view illustrating, as an example of a conventional silicon carbide semiconductor device, the structure of a double implantation MOSFET. Herein, the "double implantation MOSFET" refers to the MOSFET that is formed by using a double implantation process. As shown in FIG. 9, in the conventional silicon carbide semiconductor device, on a low-resistance substrate 101 made of silicon carbide, a high resistance layer 102 having a resistance higher than that of the substrate 101 is epitaxially grown. In a surface region of the high resistance layer 102, p-type well regions 103 are formed by selective ion implantation. By ion implantations, each p-type well region 103 is provided at the inside thereof with: a n-type source region 105 having a high concentration; and a p-type $p^+$ contact region 104 surrounded by the source region 105 adjacent thereto.

A gate insulating film 106, formed of a thermal oxide film, is formed on a portion of the high resistance layer 102 sandwiched between the two well regions 103 and on ends of the source regions 105 within the two well regions 103. On the gate insulating film 106, a gate electrode 109 is formed. On each $p^+$ contact region 104 and on an end of the source region 105 located to laterally surround the $p^+$ contact region 104, a source electrode 108 is provided so as to be in ohmic contact with the associated contact region 104. Furthermore, on the entire back side of the substrate 101, a drain electrode 107 is provided so as to be in ohmic contact with the substrate 101.

Over the high resistance layer 102, the p-type well regions 103, the $p^+$ contact regions 104 and the source regions 105, an interlayer dielectric film 110 is deposited. The interlayer dielectric film 110 is provided with contact holes that reach the source electrodes 108 and a contact hole that reaches the gate electrode 109. On the interlayer dielectric film 110, interconnects 111 and 112, each made of aluminum and having a thickness of 2 µm, are provided so as to fill the contact holes. The interconnects 111 are located on the source electrodes 108, and the interconnect 112 is located on the gate electrode 109. The above-described structure is disclosed, for example, in prior art document 1 (Japanese Unexamined Patent Publication No. 11-297712).

As the source electrodes 108, nickel, nickel silicide or a mixture thereof is normally used. This is because nickel or nickel silicide has the property of being easily in ohmic contact with n-type silicon carbide. As another example of this structure, prior art document 2 (Toshiyuki Ohno, "Current State of Process Technology of Forming Element using SiC", The Transaction of The Institute of Electronics, Information and Communication Engineers, Vol.J81-C-II, No.1, pp. 128–133, January 1998) discloses a method in which nickel is used as the source electrodes or drain electrode of an n-type silicon carbide semiconductor device and an annealing is performed at a temperature of 900° C. or more in an atmosphere of an inert gas such as argon or nitrogen, thus obtaining an ohmic characteristic. As the interlayer dielectric film 110, a silicon oxide film with a thickness of about 1 µm is normally used. This is because the breakdown electric field of silicon oxide is high, and a silicon oxide film can easily be formed by a CVD process or the like.

However, in the semiconductor device with the above-described structure, when the interlayer dielectric film 110 has been deposited, the adhesion between nickel constituting the source electrodes 108 and silicon oxide constituting the interlayer dielectric film 110 is poor, which causes the problem that the silicon oxide on the source electrodes 108 undesirably peels off. In order to solve such a problem, prior art document 3 (Japanese Unexamined Patent Publication No. 2002-093742), for example, discloses a method in which a resist mask is formed over silicon oxide, and sidewalls etching is carried out in the step of performing etching for forming a via hole in an interlayer dielectric film, thus forming the via hole having a width larger than that of an opening in the resist mask. Thereafter, nickel is deposited and lifted off using the same resist mask, thus providing a gap between the sidewalls of the via hole and the nickel film.

Prior art document 4 (Japanese Unexamined Patent Publication No. 10-125620) discloses a method for preventing a nickel interconnect from peeling off by providing a barrier metal between silicon oxide and the nickel interconnect.

However, in the method for providing a gap between the via hole and source electrode, water is likely to be absorbed into this gap, and there occurs the problem of a reduction in mechanical strength. On the other hand, in the method for providing a barrier metal, an annealing for forming an ohmic contact between the nickel electrode and substrate is performed at a temperature of about 1000° C. after an interlayer dielectric film has been formed, and therefore, there occurs the problem that the nickel in contact with the interlayer dielectric film within a contact hole undesirably reacts with the interlayer dielectric film, thus reducing the reliability of the resulting device.

SUMMARY OF THE INVENTION

In the view of the above-described problems, an object of the present invention is to provide a reliable semiconductor device by implementing a means for improving the adhesion between an electrode and an interlayer dielectric film without causing any of these problems.

An inventive silicon carbide semiconductor device includes: a semiconductor layer made of silicon carbide; an electrode provided on the semiconductor layer; an interlayer dielectric film provided on the electrode; and an interconnect that passes through the interlayer dielectric film and reaches the electrode, wherein the electrode includes: a first electrode portion in contact with the semiconductor layer; and a second electrode portion interposed between the first electrode portion and the interlayer dielectric film. In inventive silicon carbide semiconductor device, the second electrode portion is preferably made of a material whose adhesion to the interlayer dielectric film is higher than the adhesion of the first electrode portion to the interlayer dielectric film.

Thus, the second electrode portion is allowed to be in contact with the interlayer dielectric film. Therefore, even if the adhesion between the first electrode portion and the interlayer dielectric film is poor, the interlayer dielectric film is unlikely to peel off the electrode, and cracking is also unlikely to occur. Besides, in this structure, since there is no gap between the electrode and the interlayer dielectric film, a problem such as absorption of water into this gap or a reduction in mechanical strength does not occur.

In one embodiment, the second electrode portion preferably covers the top face and side faces of the first electrode portion. In such an embodiment, the interlayer dielectric film is not at all in contact with the first electrode portion, and therefore, the adhesion between the electrode and the interlayer dielectric film can be further increased.

In another embodiment, the first electrode portion may be in ohmic contact with the semiconductor layer.

In still another embodiment, the first electrode portion may include Ni. In those embodiments, the first electrode portion can be in favorable ohmic contact with the semiconductor layer made of silicon carbide, and therefore, a low contact resistance is realized.

In yet still another embodiment, the second electrode portion preferably includes at least one of Al, Ti and Cr, and the interlayer dielectric film is preferably made of silicon oxide. In such an embodiment, since the adhesion of Al, Ti and Cr to silicon oxide is high, it is possible to achieve a considerable effect in improving the adhesion between the electrode and the interlayer dielectric film.

In another embodiment, a gate electrode may be provided over the semiconductor layer.

In still another embodiment, the second electrode portion may be made of the same material as the gate electrode. In such an embodiment, it is possible to form the structure of the present invention without increasing the number of process steps.

The inventive silicon carbide semiconductor device may be a double implantation MOSFET. In the specific structure in that case, the semiconductor layer is a high resistance layer including a dopant of a first conductivity type, and the semiconductor device further includes: a semiconductor substrate that is provided on the back side of the semiconductor layer and has a first conductivity type dopant concentration higher than that of the semiconductor layer; a plurality of well regions each provided in an upper portion of the high resistance layer and including a dopant of a second conductivity type; a contact region of the second conductivity type provided in an upper portion of each well region; a source region of the first conductivity type provided in an upper portion of each of the plurality of well regions, the upper portion being located to laterally surround the contact region; a gate insulating film provided on a portion of the high resistance layer located between the plurality of well regions; and a drain electrode provided on the back side of the semiconductor substrate. The electrode is a source electrode that is provided on the contact region and on a part of the source region adjacent thereto, and the gate electrode is provided on the gate insulating film.

If the double implantation MOSFET is an accumulation-mode double implantation MOSFET, the high resistance layer is further provided, at its upper portion, with an accumulation channel layer, and the gate insulating film is provided on the accumulation channel layer.

The inventive silicon carbide semiconductor device may be a trench MOSFET. In the specific structure in that case, the semiconductor layer is a base layer including a dopant of a second conductivity type, and the semiconductor device further includes: a drift layer that is provided on the back side of the semiconductor layer and includes a dopant of a first conductivity type; a semiconductor substrate provided on the back side of the drift layer; a trench that passes through the base layer and reaches the drift layer; a gate insulating film provided on the sidewalls of the trench; a contact region of the second conductivity type provided in an upper portion of the base layer; a source region provided in an upper portion of the base layer located to laterally surround the contact region; and a drain electrode provided on the back side of the semiconductor substrate. The electrode is a source electrode that is provided on the contact region and on a part of the source region adjacent thereto, and the gate electrode is provided on the gate insulating film.

The inventive silicon carbide semiconductor device may be a lateral MOSFET. In the specific structure in that case, the semiconductor layer is a base layer including a dopant of a second conductivity type, and the semiconductor device further includes: a semiconductor substrate provided on the back side of the base layer; source and drain regions of a first conductivity type provided in upper portions of the base layer so as to be separated from each other; and a gate insulating film provided on a portion of the base layer located between the source region and the drain region. The electrode is a source electrode provided on the source region or a drain electrode provided on the drain region, and the gate electrode is provided on the gate insulating film.

The inventive silicon carbide semiconductor device may be a MESFET. In the specific structure in that case, the semiconductor layer is a drift layer including a dopant of a first conductivity type, and the semiconductor device further includes: a semiconductor substrate provided on the back side of the drift layer; and source and drain regions of the first conductivity type provided in upper portions of the drift layer so as to be separated from each other. The electrode is a source electrode provided on the source region or a drain electrode provided on the drain region, and the gate electrode is provided on a portion of the drift layer located between the source region and the drain region.

The inventive silicon carbide semiconductor device may be a static induction transistor. In the specific structure in that case, the semiconductor layer is a drift layer that includes a dopant of a first conductivity type and has a mesa, and the semiconductor device further includes: a semiconductor substrate provided on the back side of the drift layer; and a source region of the first conductivity type provided in an upper portion of the mesa of the drift layer. The electrode is a source electrode that is provided on the top face of the mesa of the drift layer so as to be in contact with the source region, and the gate electrode is provided on each side face of the mesa of the drift layer and on a part of the drift layer located on each side of the mesa.

The inventive silicon carbide semiconductor device may be a JFET. In the specific structure in that case, the semiconductor layer is a drift layer including a dopant of a first conductivity type, and the semiconductor device further includes: a semiconductor substrate provided on the back side of the drift layer; a source region of the first conductivity type provided in an upper portion of the drift layer; and gate regions of a second conductivity type provided in upper portions of the drift layer located on both sides of the source region so that the gate regions are separated from the source region. The electrode is a source electrode provided on the source region, and the gate electrode is provided on each of the gate regions.

An inventive method for fabricating a silicon carbide semiconductor device is a method for fabricating a silicon carbide semiconductor device including an element having: a semiconductor layer made of silicon carbide; and an electrode provided on the semiconductor layer. The inventive method includes the steps of: a) forming, on the semiconductor layer, a first electrode portion that constitutes a part of the electrode; b) forming a second electrode portion that covers at least a part of the first electrode portion and constitutes a part of the electrode, after the step a) has been performed; c) forming, on the semiconductor layer, an interlayer dielectric film that covers the electrode, after the step b) has been performed; d) forming a hole that passes through the interlayer dielectric film and reaches the electrode, after the step c) has been performed; and e) forming an interconnect by filling the hole with a conductor, after the step d) has been performed.

Thus, the second electrode portion is allowed to be in contact with the interlayer dielectric film. Therefore, in the semiconductor device obtained by this fabricating method, even if the first electrode portion is made of a material having poor adhesion to the interlayer dielectric film, the interlayer dielectric film is unlikely to peel off the electrode, and cracking is also unlikely to occur. Besides, in the semiconductor device obtained by this fabricating method, since there is no gap between the electrode and the interlayer dielectric film, a problem such as absorption of water into this gap or a reduction in mechanical strength does not occur. Furthermore, in order to allow the first electrode portion to be in ohmic contact with the semiconductor layer, it is necessary to perform an annealing at a high temperature after the first electrode portion has been formed. In the prior art, in some cases, an electrode is formed after an interlayer dielectric film has been formed, and then an annealing is performed. In that case, the problem that the electrode undesirably reacts with the interlayer dielectric film might occur during the annealing. However, in the present invention, such a problem can be avoided because the above-mentioned annealing can be finished before the step c) of forming the interlayer dielectric film.

In one embodiment, in the step b), a conductor film that covers at least a part of the first electrode portion and extends above the semiconductor layer is formed, and then the conductor film is patterned, thus making it possible to form the second electrode portion and a gate electrode at the same time. If the second electrode portion is formed in this manner, it becomes possible to obtain the inventive semiconductor device without making the number of process steps larger than that of process steps in the prior art.

In another embodiment, in the step b), the second electrode portion is preferably formed so as to completely cover the top face and side faces of the first electrode portion. In such an embodiment, since the first electrode portion is not in contact with the interlayer dielectric film, the adhesion between the electrode and the interlayer dielectric film can be further increased. Furthermore, during the formation of the hole in the interlayer dielectric film, the first electrode portion is covered with the second electrode portion, and therefore, the removal of the first electrode portion can be prevented.

In still another embodiment, the first electrode portion may include Ni. In such an embodiment, the first electrode portion can be in favorable ohmic contact with the semiconductor layer made of silicon carbide, and therefore, a low contact resistance is realized.

In yet still another embodiment, the second electrode portion preferably includes at least one of Al, Ti and Cr, and the interlayer dielectric film is preferably made of silicon oxide. In such an embodiment, since the adhesion of Al, Ti and Cr to silicon oxide is high, it is possible to achieve a considerable effect in improving the adhesion between the electrode and the interlayer dielectric film.

The element may be a double implantation MOSFET, a trench MOSFET, a lateral MOSFET, a MESFET, a static induction transistor, or a JFET.

DESCRIPTION OF THE PREFERRED EMBODIMENTS

First Embodiment

Figure 1:
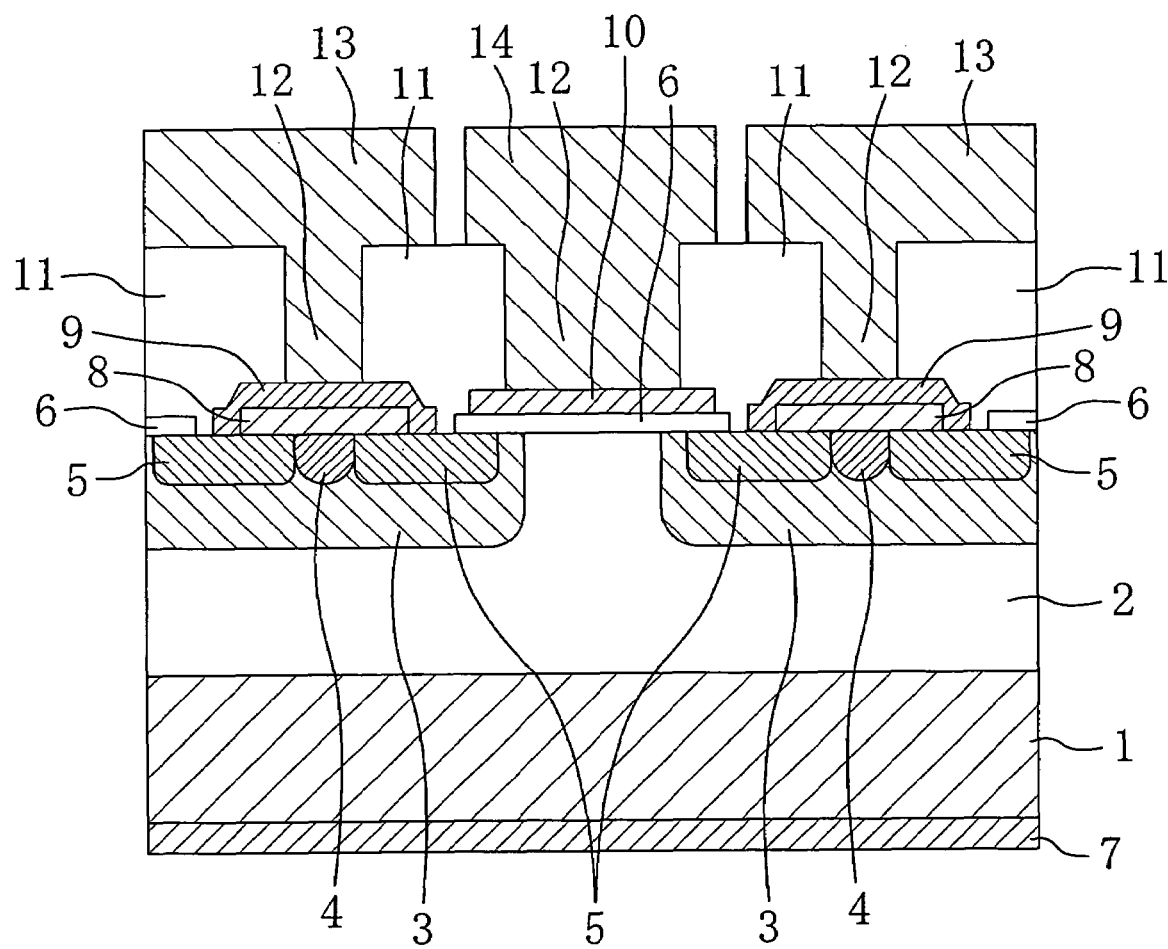
FIG. 1 is a cross-sectional view illustrating the structure of an inversion-mode double implantation MOSFET according to a first embodiment of the present invention.

Hereinafter, a double implantation MOSFET that is an exemplary silicon carbide semiconductor device according to the present invention will be described in detail with reference to the accompanying drawings. FIG. 1 is a cross-sectional view illustrating the structure of an inversion-mode double implantation MOSFET according to a first embodiment of the present invention.

As shown in FIG. 1, in the double implantation MOSFET of the present embodiment, a high resistance layer 2 having an n-type dopant concentration of $1 \times 10^{15}$ $cm^{-3}$ to $1 \times 10^{16}$ $cm^{-3}$ is formed on a low-resistance silicon carbide substrate 1 having an n-type dopant concentration of $1 \times 10^{18}$ $cm^{-3}$ or more. The high resistance layer 2 is provided at its surface region with well regions 3 each having a p-type dopant concentration of $1 \times 10^{16}$ $cm^{-3}$ to $1 \times 10^{17}$ $cm^{-3}$, for example. Each well region 3 is provided at the inside thereof with: a $p^+$ contact region 4 having a p-type dopant concentration of $1×10^{18}$ cm$^{-3}$ or more; and a source region 5 having an n-type dopant concentration of about $1×10^{19}$ cm$^{-3}$.

On the p$^+$ contact regions 4 and on parts of the source regions 5 located to laterally surround the p$^+$ contact regions 4, first source electrodes 8 made of nickel or nickel silicide are provided so as to be in ohmic contact with the p$^+$ contact regions 4 and the source regions 5. Further, second source electrodes 9 made of aluminum are formed so as to cover the side faces and top faces of the first source electrodes 8. In this embodiment, the second source electrodes 9 do not have to completely cover the top faces of the first source electrodes 8. That is, it is sufficient that the second source electrodes 9 are interposed between the first source electrodes 8 and an interlayer dielectric film 11 made of silicon oxide so as not to allow the first source electrodes 8 to be in direct contact with the interlayer dielectric film 11.

As a material for the second source electrodes 9, a metal whose adhesion to the interlayer dielectric film 11 is good is selected. If the interlayer dielectric film 11 is made of silicon oxide as mentioned above, it is preferable to use aluminum, titanium or chromium as the second source electrodes 9. Even if other material is used as the second source electrodes 9, the effects of the present invention can be achieved as long as the adhesion of the material to the interlayer dielectric film 11 is higher than that of the first source electrodes 8 to the interlayer dielectric film 11.

On the entire back side of the silicon carbide substrate 1, a drain electrode 7 made of nickel and in ohmic contact with the silicon carbide substrate 1 is provided.

A gate insulating film 6 is provided on a portion of the high resistance layer 2 sandwiched between the two well regions 3 and on ends of the source regions 5 within the two well regions 3. Furthermore, on the gate insulating film 6, a gate electrode 10 made of aluminum is provided.

Over the high resistance layer 2, well regions 3, source regions 5 and p$^+$ contact regions 4, an interlayer dielectric film 11 is deposited. The interlayer dielectric film 11 is provided with contact holes 12 that reach the second source electrodes 9 and the gate electrode 10. On the interlayer dielectric film 11, interconnects 13 and 14, each formed of aluminum and having a thickness of 2 μm, are provided so as to fill the contact holes 12. The interconnects 13 are located on the second source electrodes 9, and the interconnect 14 is located on the gate electrode 10.

In the semiconductor device shown in FIG. 1, electric current flows from the interconnects 13, located on the second source electrodes 9, to the source regions 5 through the second source electrodes 9 and the first source electrodes 8. The electric current flows through a channel formed below the gate electrode 10, the high resistance layer 2 and the silicon carbide substrate 1, and then flows to the drain electrode 7.

Hereinafter, a method for fabricating the silicon carbide semiconductor device shown in FIG. 1 will be described with reference to FIGS. 2A through 2I. FIGS. 2A through 2I are cross-sectional views illustrating respective process steps for fabricating the semiconductor device according to the first embodiment of the present invention.

Figure 2A:
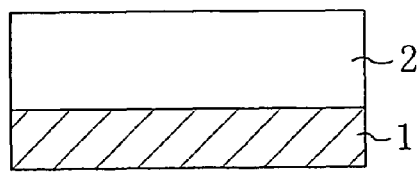
FIGS. 2A through 2I are cross-sectional views illustrating respective process steps for fabricating the semiconductor device according to the first embodiment of the present invention.

First, in the process step shown in FIG. 2A, a silicon carbide substrate 1 having a principal plane that is 8° off from the (0001) plane toward the <11–20> direction and having an n-type dopant concentration of $1×10^{18}$ cm$^{-3}$ to $5×10^{19}$ cm$^{-3}$ is prepared, and an n-type high resistance layer 2 with a thickness of 10 μm or more is epitaxially grown on the silicon carbide substrate 1.

For example, a thermal CVD process is performed by using silane (SiH$_4$) and propane (C$_3$H$_8$) as a material gas, using hydrogen (H$_2$) as a carrier gas, and using a nitrogen (N$_2$) gas as a dopant gas, thus epitaxially growing the high resistance layer 2 having a dopant concentration lower than that of the silicon carbide substrate 1. For example, if a MOSFET that withstands 600 V is to be fabricated, the high resistance layer 2 preferably has a dopant concentration of $1×10^{15}$ cm$^{-3}$ to $1×10^{16}$ cm$^{-3}$ and a thickness of 10 μm or more.

Figure 2B:
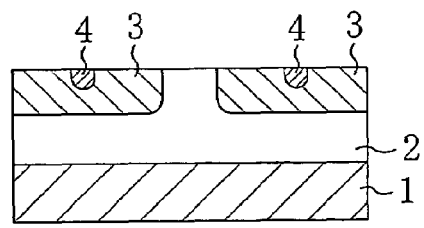

Next, in the process step shown in FIG. 2B, a CVD process is performed to deposit, on the high resistance layer 2, an implantation mask (not shown) formed of a silicon oxide film with a thickness of 3 μm, and then photolithography and dry etching are performed to form openings (not shown). Thereafter, aluminum or boron ions are implanted from above the implantation mask (not shown) while the substrate is kept at a temperature as high as 500° C. or more in order to reduce implantation defects, thus forming p-type well regions 3 in upper portions of the high resistance layer 2. Each well region 3 normally has a dopant concentration in the range of about $1×10^{15}$ cm$^{-3}$ to $1×10^{17}$ cm$^{-3}$ and a depth of about 1 μm so as not to cause pinch-off. Then, the implantation mask is removed using hydrofluoric acid.

Subsequently, a mask (not shown) having openings that partially expose the surfaces of the well regions 3 is formed over the substrate, and then p-type ions are implanted, thereby forming p$^+$ contact regions 4 each having a depth of 300 nm and a dopant concentration of $1×10^{18}$ cm$^{-3}$ or more. By forming these p$^+$ contact regions 4 such that the dopant concentration of each p$^+$ contact region 4 is higher than that of each well region 3, the p-type well regions 3 can easily be in ohmic contact with the subsequently formed electrodes. Thereafter, in an inert gas such as argon, activation annealing is carried out at a temperature of about 1700° C. for 30 minutes.

Figure 2C:
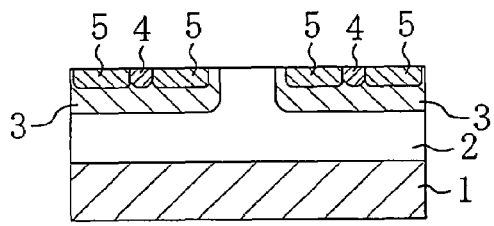

Next, in the process step shown in FIG. 2C, an implantation mask (not shown) formed of a silicon oxide film is deposited to a thickness of 1 μm over the substrate, and photolithography and dry etching are performed to form openings (not shown) over portions of the well regions 3 surrounding the p$^+$ contact regions 4. Then, in order to reduce implantation defects, nitrogen or phosphorus ions are implanted with the substrate kept at a temperature as high as 500° C. or more, thereby forming source regions 5 each having a depth of 300 nm and a dopant concentration of $1×10^{19}$ cm$^{-3}$. Thereafter, the implantation mask is removed using hydrofluoric acid, and activation annealing is carried out at a temperature of about 1700° C. for 30 minutes in an atmosphere of an inert gas such as argon.

Figure 2D:
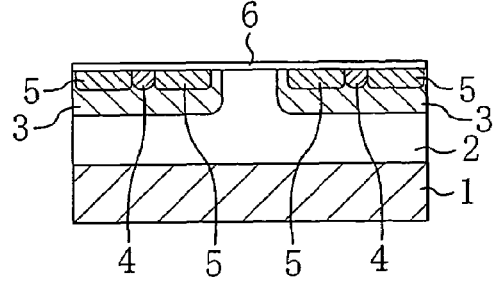

Subsequently, in the process step shown in FIG. 2D, the substrate is held in a quartz tube, and bubbling oxygen is introduced at a flow rate of 2.5 SLM (l/s) with the inside of the quartz tube kept at a temperature of 1100° C., thus carrying out thermal oxidation for 3 hours. As a result, a silicon oxide film with a thickness of about 40 nm is grown as a gate insulating film 6 on the surface of the high resistance layer 2.

Figure 2E:
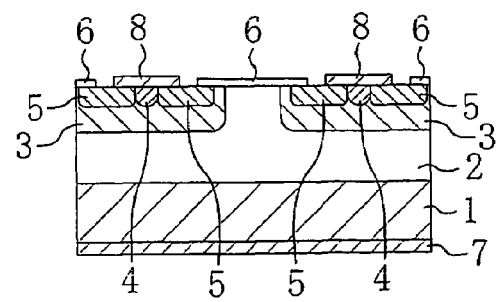

Then, in the process step shown in FIG. 2E, a drain electrode 7 made of nickel and having a thickness of 200 nm is deposited onto the back side of the substrate. Further, photolithography and hydrofluoric acid etching are performed to partially remove the gate insulating film 6, thereby exposing the surfaces of the p$^+$ contact regions 4 and partially exposing the surfaces of the source regions 5. Thereafter, a lift-off process is performed to form first source electrodes 8 each being made of nickel and in contact with both of the associated p$^+$ contact region 4 and a part of the associated source region 5.

Subsequently, in order to obtain ohmic characteristics of the first source electrodes 8 and the drain electrode 7, an annealing is performed at a temperature of about 1000° C. for 2 minutes in an atmosphere of an inert gas such as nitrogen. By performing this annealing, the nickel reacts with the silicon carbide, and a part of the nickel or the whole nickel becomes nickel silicide.

Figure 2F:
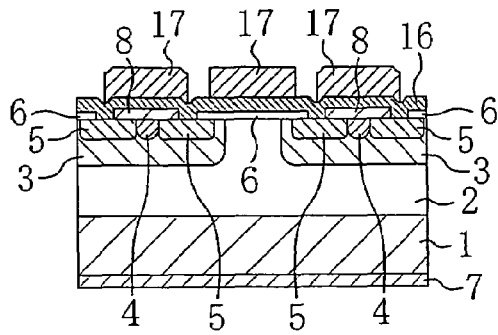

Then, in the process step shown in FIG. 2F, an aluminum film 16 is deposited to a thickness of 200 nm over the substrate so as to cover the gate insulating film 6 and the first source electrodes 8. Thereafter, a normal photolithography is performed on the aluminum film 16, thereby forming a resist pattern 17 that covers the gate insulating film 6 and the first source electrodes 8.

In this fabricating method, the alignment accuracy in the photolithography for forming second source electrodes 9 is preferably taken into consideration, and each second source electrode 9 is preferably formed to be wider than each first source electrode 8 by at least 1 µm or more. Thus, even if a misalignment of 1 µm is to be caused, it will be possible to cover the top faces and side faces of the first source electrodes 8 with the second source electrodes 9.

Figure 2G:
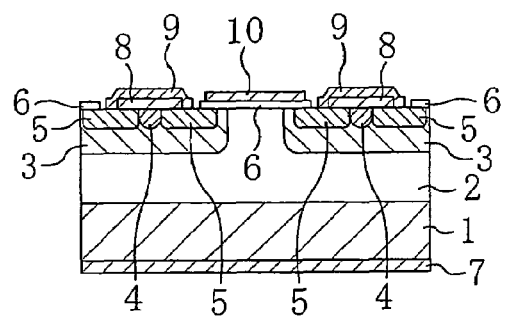

Next, in the process step shown in FIG. 2G, a RIE process with in which a chlorine-containing gas is used is performed to pattern the aluminum film 16 (which is shown in FIG. 2F). Thus, a gate electrode 10 is formed on the gate insulating film 6, and at the same time, the second source electrodes 9 that are made of the same material (i.e., aluminum) as the gate electrode 10 and completely cover the top faces and side faces of the first source electrodes 8 are formed.

Figure 2H:
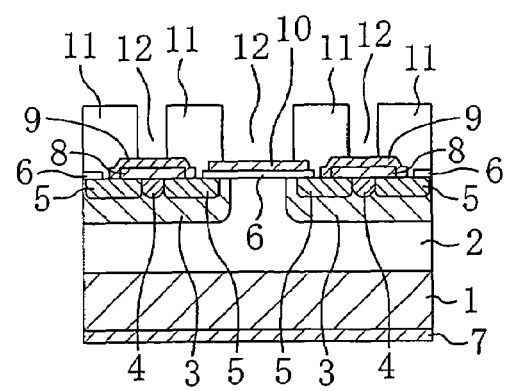

Then, in the process step shown in FIG. 2H, an interlayer dielectric film 11, formed of a silicon oxide film with a thickness of 1 µm, is formed over the substrate so as to cover the second source electrodes 9 and the gate electrode 10. Thereafter, a RIE process with a fluorocarbon-containing gas such as $CF_4$ or $CHF_3$ is performed, thereby providing, in the interlayer dielectric film 11, contact holes 12 that reach the second source electrodes 9 and the gate electrode 10. At this time, the aluminum used as the material for the second source electrodes 9 and the gate electrode 10 serves as an etch stopper.

Figure 2I:
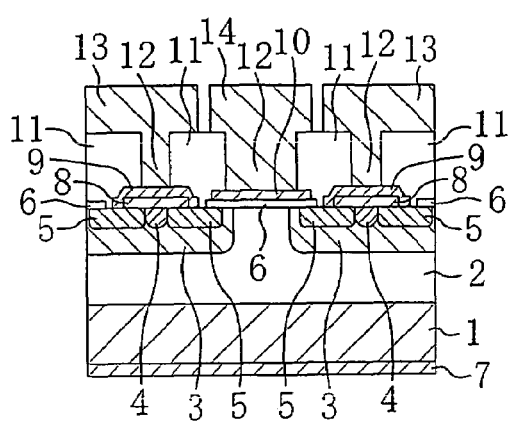

Then, in the process step shown in FIG. 2I, a sputtering process or the like is performed, thus forming, on the interlayer dielectric film 11, an aluminum film (not shown) having a thickness of 2 µm. Thereafter, a normal wet etching process is performed to pattern the aluminum film, thus forming upper interconnects (i.e., interconnects 13 located on the source electrodes 9, and an interconnect 14 located on the gate electrode 10) which fill the contact holes 12 and extend above the interlayer dielectric film 11. The interconnects 13, located on the source electrodes 9, are connected to a plurality of source electrodes (not shown), while the interconnect 14, located on the gate electrode 10, is connected to a plurality of gate electrodes (not shown).

In the present embodiment, since the first source electrodes 8 are made of nickel, the contact resistance between the first source electrodes 8 and the source regions 5 can be $1 \times 10^{-5}$ $\Omega \cdot cm^2$ or less. At the same time, since the second source electrodes 9 are interposed between the first source electrodes 8 and the interlayer dielectric film 11, it becomes unnecessary to allow the nickel constituting the first source electrodes 8, having poor adhesion, to be in contact with the silicon oxide film constituting the interlayer dielectric film 11. Furthermore, since the aluminum, titanium or chromium constituting the second source electrodes 9 exhibits high adhesion to the silicon oxide film, the interlayer dielectric film 11 is unlikely to peel off the second source electrodes 9, and cracking is also unlikely to occur. Besides, in this structure, since there is no gap between the second source electrodes 9 and the interlayer dielectric film 11, a problem such as absorption of water into this gap or a reduction in mechanical strength does not occur.

In order to allow the first source electrodes 8 to be in ohmic contact with the source regions 5, it is necessary to perform an annealing at a high temperature after the first source electrodes 8 have been formed. In prior art, there is a case where source electrodes are formed after an interlayer dielectric film has been formed, and then an annealing is performed. In such a case, during the annealing, there occurs the problem that nickel constituting the source electrodes undesirably reacts with the interlayer dielectric film or gate insulating film. However, in the present invention, such a problem can be avoided because the above-described annealing can be finished before the step of forming the interlayer dielectric film 11.

Further, since the second source electrodes 9 and the gate electrode 10 can be formed in the same process step, the number of process steps and the fabrication cost in the present embodiment will not be larger than those in the prior art.

Furthermore, when the second source electrodes 9 are formed by patterning the aluminum film 16, regions thereof that become the second source electrodes 9 are covered with the resist pattern 17, thus eliminating the possibility of erosion or contamination of the surfaces of the second source electrodes 9 due to an etchant.

Moreover, during the formation of the contact holes 12 in the interlayer dielectric film 11, the first source electrodes 8 are covered with the second source electrodes 9, and therefore, the removal of the first source electrodes 8 can be prevented.

In the present embodiment, aluminum is employed as the material for the gate electrode 10. Alternatively, in this invention, other metal material may be used. Specifically, it is preferable to use a metal that provides a low etch rate in the RIE process in which a fluorocarbon-containing gas is used and that exhibits good adhesion to the silicon oxide film, and therefore, copper (Cu), for example, may be used. Generally, it is difficult to etch copper by a RIE process, and thus the gate electrode 10 may be formed by a wet etching process in which a ferric chloride solution, for example, is used as an etchant.

Although an example of an n-channel MOSFET has been described in the present embodiment, the present invention may also be applicable to a p-channel MOSFET in which a p-type high resistance layer is epitaxially grown on a p-type silicon carbide substrate, and n-type well regions are formed. In such a case, the similar effects can also be achieved.

Second Embodiment

Figure 3:
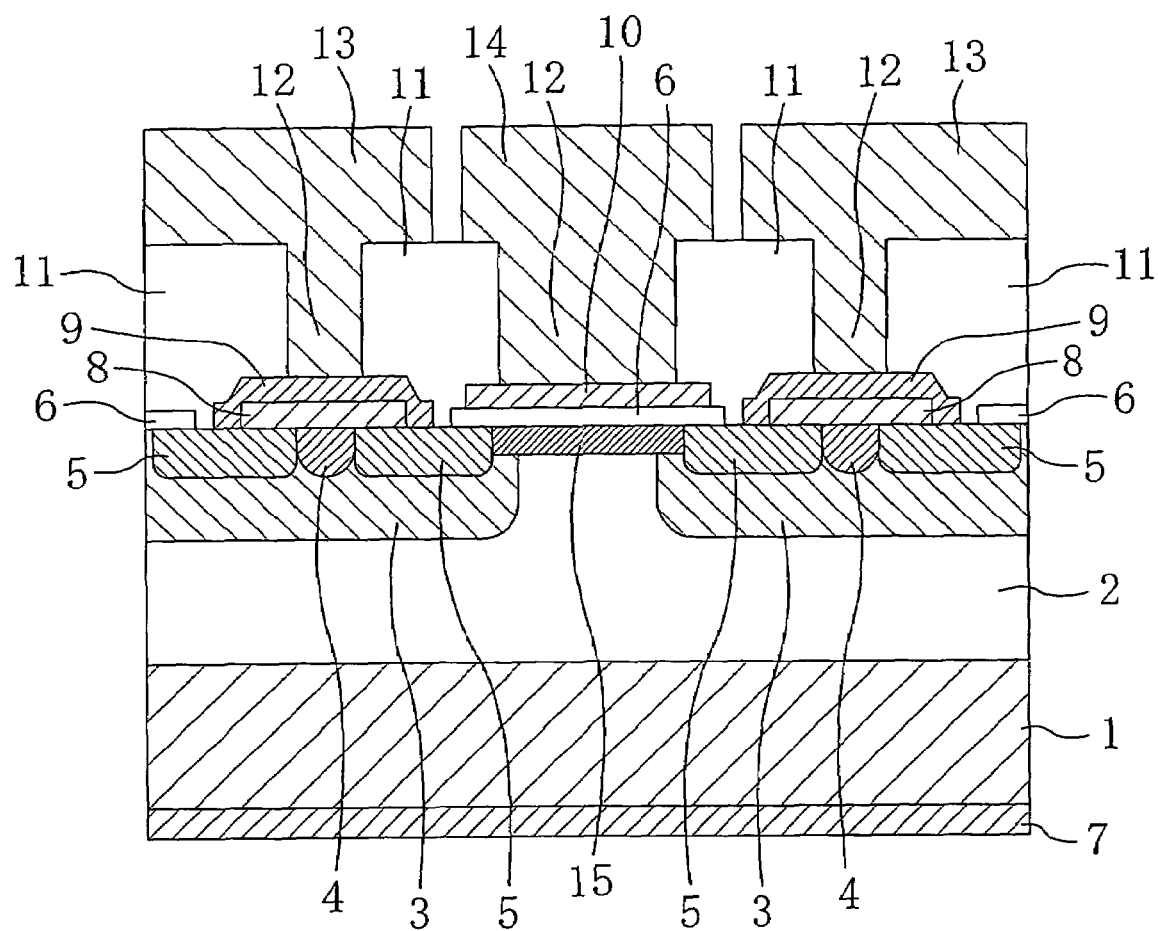
FIG. 3 is a cross-sectional view illustrating the structure of an accumulation-mode double implantation MOSFET according to a second embodiment of the present invention.

Although the inversion-mode double implantation MOSFET has been described by way of example in the above-described first embodiment, an accumulation-mode double implantation MOSFET will be described by way of example in the second embodiment. FIG. 3 is a cross-sectional view illustrating the structure of an accumulation-mode double implantation MOSFET according to the second embodiment of the present invention.

The second embodiment differs from the first embodiment in that an accumulation channel layer 15 is provided between a gate insulating film 6, and a high resistance layer 2 and well regions 3. Since carbon remains in a thermal oxide film of silicon carbide semiconductor, many defects exist at the interface between the gate insulating film 6 and the high resistance layer 2 made of silicon carbide, resulting in a reduction in channel mobility. However, in the case of the accumulation-mode MOSFET, an electric current is allowed to flow through a region that is more distant from the interface than the inversion-mode MOSFET, and therefore, a channel mobility is improved. The MOSFET of the present embodiment will be described in detail below.

As shown in FIG. 3, in the double implantation MOSFET of the present embodiment, the high resistance layer 2 having an n-type dopant concentration of $1 \times 10^{15}$ cm$^{-3}$ to $1 \times 10^{16}$ cm$^{-3}$ is formed on a low-resistance silicon carbide substrate 1 having an n-type dopant concentration of $1 \times 10^{18}$ cm$^{-3}$ or more. The high resistance layer 2 is provided at its surface region with the accumulation channel layer 15 having an n-type dopant concentration of $1 \times 10^{16}$ cm$^{-3}$ to $5 \times 10^{17}$ cm$^{-3}$ and a depth of about 0.2 μm. This accumulation channel layer 15 is formed in the entire surface region of the high resistance layer 2, including the well regions 3, by a thermal CVD process, for example, similar to that performed for the high resistance layer 2.

The surface region of the high resistance layer 2 is partially provided with the well regions 3 each having a p-type dopant concentration of $1 \times 10^{16}$ cm$^{-3}$ to $1 \times 10^{18}$ cm$^{-3}$, for example. Each well region 3 is provided at the inside thereof with: a source region 5 having an n-type dopant concentration of $1 \times 10^{18}$ cm$^{-3}$ or more; and a p$^+$ contact region 4 that is surrounded by the source region 5 and has a p-type dopant concentration of about $1 \times 10^{19}$ cm$^{-3}$.

On the p$^+$ contact regions 4 and on parts of the source regions 5 located to laterally surround the p$^+$ contact regions 4, first source electrodes 8 made of nickel or nickel silicide are provided so as to be in ohmic contact with the p$^+$ contact regions 4 and the source regions 5. Further, second source electrodes 9 made of aluminum are formed so as to cover the side faces and top faces of the first source electrodes 8. In this embodiment, the second source electrodes 9 do not have to completely cover the top faces of the first source electrodes 8. That is, it is sufficient that the second source electrodes 9 are interposed between the first source electrodes 8 and an interlayer dielectric film 11 made of silicon oxide so as not to allow the first source electrodes 8 to be in direct contact with the interlayer dielectric film 11.

As a material for the second source electrodes 9, a metal whose adhesion to the interlayer dielectric film 11 is good is selected. If the interlayer dielectric film 11 is made of silicon oxide as mentioned above, it is preferable to use aluminum, titanium or chromium as the second source electrodes 9. Even if other material is used as the second source electrodes 9, the effects of the present invention can be achieved as long as the adhesion of the material to the interlayer dielectric film 11 is higher than that of the first source electrodes 8 to the interlayer dielectric film 11.

On the entire back side of the silicon carbide substrate 1, a drain electrode 7 made of nickel and in ohmic contact with the silicon carbide substrate 1 is provided.

The gate insulating film 6 is provided on the accumulation channel layer 15 sandwiched between the two well regions 3, and on parts of the two well regions 3. Furthermore, on the gate insulating film 6, a gate electrode 10 made of aluminum is provided.

Over the accumulation channel layer 15 and the well regions 3, the interlayer dielectric film 11 is deposited. The interlayer dielectric film 11 is provided with contact holes 12 that reach the second source electrodes 9 and the gate electrode 10. On the interlayer dielectric film 11, interconnects 13 and 14, each made of aluminum and having a thickness of 2 μm, are provided so as to fill the contact holes 12. The interconnects 13 are located on the second source electrodes 9, and the interconnect 14 is located on the gate electrode 10. The interconnects 13, located on the second source electrodes 9, are connected to a plurality of source electrodes (not shown), while the interconnect 14, located on the gate electrode 10, is connected to a plurality of gate electrodes (not shown).

In the semiconductor device shown in FIG. 3, electric current flows from the interconnects 13, located on the second source electrodes 9, to the source regions 5 through the second source electrodes 9 and the first source electrodes 8. The electric current flows through the accumulation channel layer 15 below the gate electrode 10, the high resistance layer 2 and the silicon carbide substrate 1, and then flows to the drain electrode 7.

In the present embodiment, the effects similar to those of the first embodiment can be obtained, and in addition, the channel mobility can be further improved, thus making it possible to further reduce on resistance.

The above description has been made by using, as an example, the MOSFET in which an n-type dopant is uniformly distributed to form the accumulation channel layer 15. Alternatively, in the present embodiment, the accumulation channel layer 15 may be formed by a multilayer structure made up of an extremely thin doped layer having a high dopant concentration and an undoped layer. As a specific example of this structure, there is a multilayer structure made up of: a doped layer having a thickness of 10 nm and a dopant concentration of $5 \times 10^{17}$ cm$^{-3}$ to $5 \times 10^{18}$ cm$^{-3}$; and an undoped layer having a thickness of about 40 nm which is not subjected to an intentional doping. If such a multilayer structure is used as the channel layer, carriers supplied from the doped layer move through the undoped layer of high crystallinity, and therefore, the use of this multilayer structure as the channel layer is further effective in improving the mobility.

Although an example of an n-channel MOSFET has been described in the present embodiment, the present invention may also be applicable to a p-channel MOSFET in which a p-type high resistance layer is epitaxially grown on a p-type silicon carbide substrate, and n-type well regions are formed. In such a case, the similar effects can also be achieved.

Third Embodiment

Figure 4:
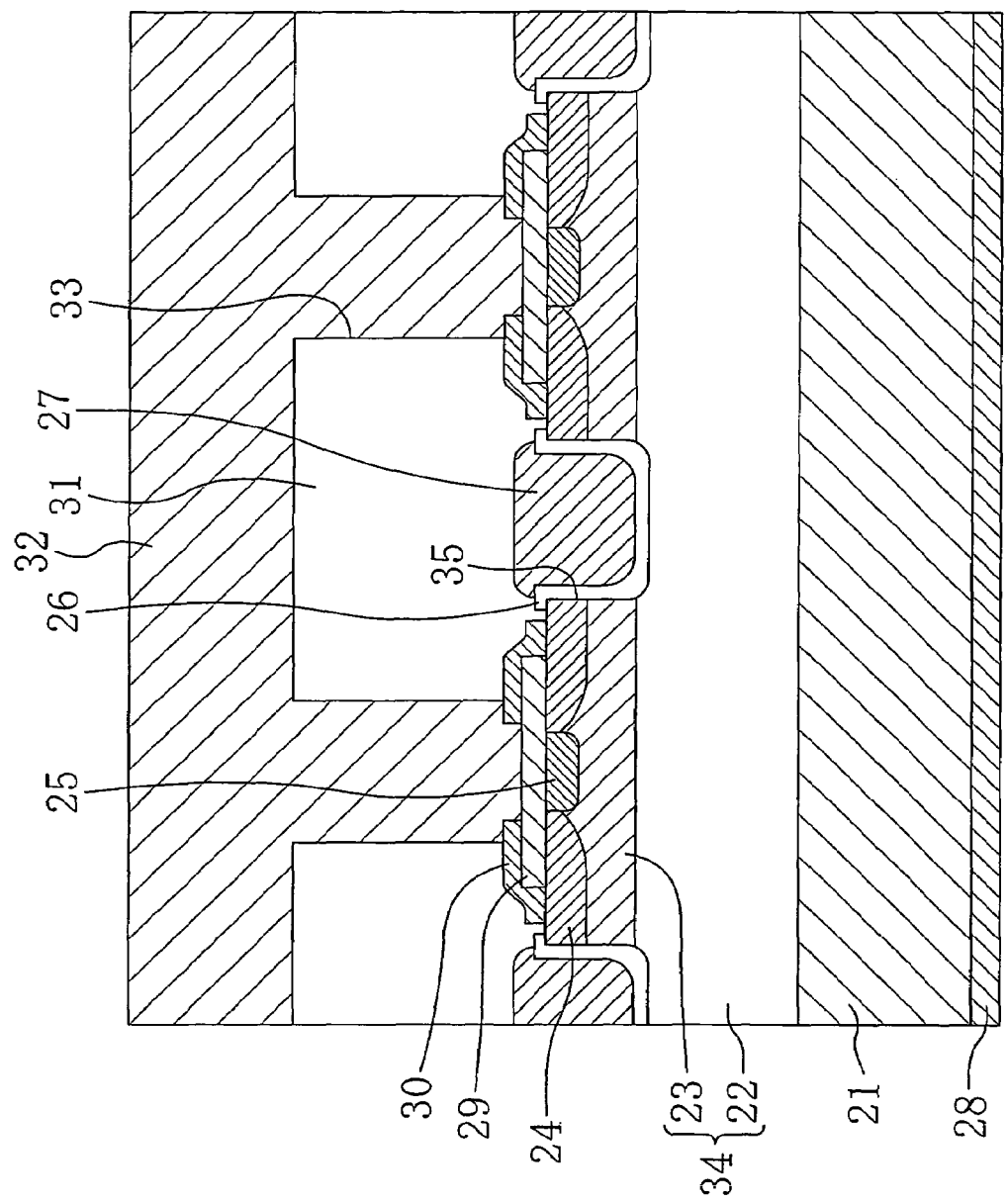
FIG. 4 is a cross-sectional view illustrating the structure of a trench MOSFET according to a third embodiment of the present invention.

In the present embodiment, a trench MOSFET will be described. FIG. 4 is a cross-sectional view illustrating the structure of a trench MOSFET according a third embodiment of the present invention.

As shown in FIG. 4, in the trench MOSFET of the present embodiment, a semiconductor layer 34 having: a drift layer 22 made of an n-type SiC; and base layers 23 each made of a p-type SiC is provided on a low-resistance n-type 4H—SiC substrate 21 having a principal plane that is 8 degrees off from the (0001) plane. For example, in the case of the MOSFET that withstands 600 V, the drift layer 22 has a carrier concentration of $1 \times 10^{15}$ cm$^{-3}$ to $1 \times 10^{16}$ cm$^{-3}$, and a thickness of 6 μm to 20 μm. On the other hand, each base layer 23 has a carrier concentration of $5 \times 10^{15}$ cm$^{-3}$ to $1 \times 10^{16}$ cm$^{-3}$, and a thickness of 2 μm to 5 μm.

The semiconductor layer 34 is partially provided with trenches 35 that pass through the base layers 23 and reach the drift layer 22, and a gate insulating film 26, formed of a thermal oxide film and having a thickness of about 40 nm, is formed on the bottom and sidewalls of each trench 35. Further, gate electrodes 27 made of low-resistance polysilicon or metal are formed to fill the trenches 35 whose surfaces have the gate insulating film 26 formed.

In the center portion of each base layer 23 located between two of the trenches 35, a contact region 25 containing a p-type dopant at a concentration of $1 \times 10^{19}$ cm$^{-3}$ or more and having a depth of 0.3 μm is provided. Provided to laterally surround the contact regions 25 are source regions 24 each being in contact with the gate insulating film 26 within the trench 35, containing an n-type dopant at a concentration of $1 \times 10^{18}$ cm$^{-3}$ to $1 \times 10^{20}$ cm$^{-3}$, and having a depth of 0.3 μm.

On each contact region 25 and on the source region 24 located to laterally surround the contact region 25, a first electrode 29 made of nickel and having a thickness of 100 nm is provided. In this embodiment, a RTA process is performed at a temperature of about 1000° C. after the first electrodes 29 have been deposited, thus allowing the first electrodes 29 to be in ohmic contact with the source regions 24. By increasing the concentration of the p-type dopant contained in each contact region 25, the nickel constituting the first electrodes 29 is allowed to be in ohmic contact with the contact regions 25.

The surface of each first electrode 29 is provided, at its ends and sides, with second electrodes 30 each made of aluminum and having a thickness of 150 nm. In this embodiment, the second electrodes 30 are preferably interposed between the first electrodes 29 and an interlayer dielectric film 31 made of silicon oxide such that the first electrodes 29 are not in direct contact with the interlayer dielectric film 31 located thereabove. Of course, as already described in the first and second embodiments, the second electrodes 30 may cover the entire top faces of the first electrodes 29 in the semiconductor device of the present embodiment.

As a material for the second electrodes 30, a metal whose adhesion to the interlayer dielectric film 31 is good is selected. If the interlayer dielectric film 31 is made of silicon oxide as mentioned above, it is preferable to use aluminum, titanium or chromium as the second electrodes 30. Even if other material is used as the second electrodes 30, the effects of the present invention can be achieved as long as the adhesion of the material to the interlayer dielectric film 31 is higher than that of the first electrodes 29 to the interlayer dielectric film 31.

The interlayer dielectric film 31, formed of a CVD oxide film and having a thickness of 1.5 μm, is provided over the semiconductor layer 34 so as to cover the second electrodes 30 and the gate electrodes 27. The interlayer dielectric film 31 is provided with contact holes 33 that reach the top faces of the second electrodes 30. On the interlayer dielectric film 31, an upper interconnect 32, made of aluminum and having a thickness of 3 μm, is provided so as to fill the contact holes 33.

Although not illustrated in the cross section shown in FIG. 4, the interlayer dielectric film 31 is further provided with another contact hole (not shown) that reaches the gate electrode 27, and the gate electrode 27 is electrically connected, via another upper interconnect (not shown), to a gate electrode pad (not shown) provided over the interlayer dielectric film 31.

On the back side of the substrate 21, a drain electrode 28 made of nickel and having a thickness of 200 nm is formed. In this embodiment, by performing a RTA process at a temperature of 1000° C. after the drain electrode 28 has been provided, the substrate 21 can be in ohmic contact with the drain electrode 28.

In the present embodiment, since the first electrodes 29 are made of nickel, the contact resistance between the first electrodes 29 and the source regions 24 can be $1 \times 10^{-5}$ Ω·cm$^2$ or less. At the same time, since the second electrodes 30 are interposed between the first electrodes 29 and the interlayer dielectric film 31, it becomes unnecessary to allow the nickel constituting the first electrodes 29, having poor adhesion, to be in contact with the silicon oxide film constituting the interlayer dielectric film 31. Furthermore, since the aluminum, titanium or chromium constituting the second electrodes 30 exhibits high adhesion to the silicon oxide film, the interlayer dielectric film 31 is unlikely to peel off the second electrodes 30, and cracking is also unlikely to occur. Besides, in this structure, since there is no gap between the second electrodes 30 and the interlayer dielectric film 31, a problem such as absorption of water into this gap or a reduction in mechanical strength does not occur.

Fourth Embodiment

Figure 5:
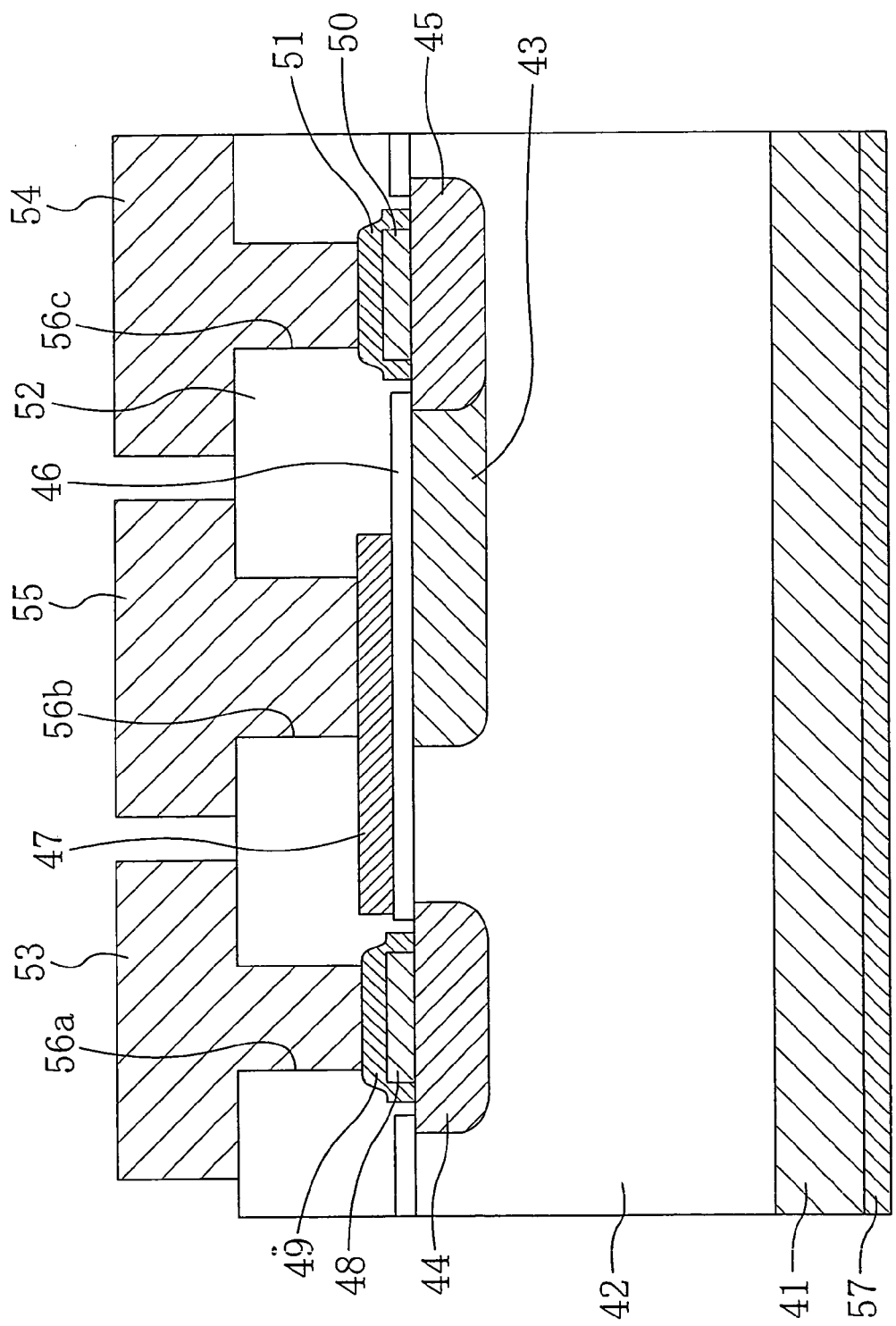
FIG. 5 is a cross-sectional view illustrating the structure of a lateral MOSFET according to a fourth embodiment of the present invention.

In the present embodiment, a lateral MOSFET will be described. Herein, the "lateral MOSFET" refers to the MOSFET in which an electric current flows in a lateral direction. FIG. 5 is a cross-sectional view illustrating the structure of a lateral MOSFET according to a fourth embodiment of the present invention.

As shown in FIG. 5, in the lateral MOSFET of the present embodiment, a p-type base layer 42 having a carrier concentration of $1 \times 10^{15}$ cm$^{-3}$ to $1 \times 10^{16}$ cm$^{-3}$ and a thickness of 5 μm is formed on a low-resistance n-type 4H—SiC substrate 41 having a principal plane that is 8 degrees off from the (0001) plane.

On the back side of the substrate 41, a base electrode 57 made of aluminum and having a thickness of 200 nm is provided. In this embodiment, after the base electrode 57 has been provided, a RTA process is performed at a temperature of about 1000° C., thereby allowing the substrate 41 to be in ohmic contact with the base electrode 57.

In a surface region of the p-type base layer 42, source and drain regions 44 and 45, each having an n-type dopant concentration of $1 \times 10^{18}$ cm$^{-3}$ or more and a depth of 0.3 μm, are provided so as to be separated from each other. The p-type base layer 42 is provided, at its portion located between the source and drain regions 44 and 45, with a drift layer 43 adjacent to the drain region 45. The drift layer 43 has an n-type dopant concentration of $1 \times 10^{14}$ cm$^{-3}$ to $1 \times 10^{16}$ cm$^{-3}$ and a depth approximately equivalent to that of the drain region 45. Since the drift layer 43 is provided, the high electric field in the vicinity of the drain region 45 can be reduced, thus improving the capability of the MOSFET to withstand high voltage.

A gate insulating film 46, formed of a thermal oxide film having a thickness of 40 nm, is provided on a part of the p-type base layer 42 located between the source and drain regions 44 and 45, and on parts of the source and drain regions 44 and 45. On the gate insulating film 46, a gate electrode 47 made of low-resistance polysilicon, metal or metal compound is provided.

On the source region 44, a first electrode 48 made of nickel and having a thickness of 100 nm is provided. Similarly, on the drain region 45, another first electrode 50 made of nickel and having a thickness of 100 nm is provided. In this embodiment, after the first electrodes 48 and 50 have been formed, a RTA process is performed at a temperature of about 1000° C., thereby allowing the first electrodes 48 and 50 to be in ohmic contact with the source and drain regions 44 and 45, respectively.

Furthermore, the first electrode 48 is provided at its top face and side faces with a second electrode 49 having a thickness of 150 nm such that the second electrode 49 covers the first electrode 48. Similarly, the first electrode 50 is provided at its top face and side faces with another second electrode 51 having a thickness of 150 nm such that the second electrode 51 covers the first electrode 50. In this embodiment, the second electrodes 49 and 51 do not have to completely cover the top faces of the first electrodes 48 and 50. That is, it is sufficient that the second electrodes 49 and 51 are interposed between the first electrodes 48 and 50 and an interlayer dielectric film 52 made of silicon oxide so as not to allow the first electrodes 48 and 50 to be in direct contact with the interlayer dielectric film 52.

As a material for the second electrodes 49 and 51, a metal whose adhesion to the interlayer dielectric film 52 is good is selected. If the interlayer dielectric film 52 is made of silicon oxide as mentioned above, it is preferable to use aluminum, titanium or chromium as the second electrodes 49 and 51. Even if other material is used as the second electrodes 49 and 51, the effects of the present invention can be achieved as long as the adhesion of the material to the interlayer dielectric film 52 is higher than that of the first electrodes 48 and 50 to the interlayer dielectric film 52.

The interlayer dielectric film 52 made of silicon oxide and having a thickness of 1.5 µm is provided over the p-type base layer 42 so as to cover the second electrodes 49 and 51 and the gate electrode 47.

The interlayer dielectric film 52 is provided with contact holes 56$a$, 56$b$ and 56$c$ that reach the second electrode 49, the gate electrode 47 and the second electrode 51, respectively. On the interlayer dielectric film 52, a source electrode pad 53, a gate electrode pad 55 and a drain electrode pad 54, each made of aluminum and having a thickness of 3 µm, are provided so as to fill the contact holes 56$a$, 56$b$ and 56$c$, respectively.

In the present embodiment, since the first electrodes 48 and 50 are made of nickel, the contact resistance between the first electrodes 48 and 50 and the source and drain regions 44 and 45 can be as low as $1 \times 10^{-5}$ Ω·cm² or less. At the same time, since the second electrodes 49 and 51 are interposed between the first electrodes 48 and 50 and the interlayer dielectric film 52, it becomes unnecessary to allow the nickel constituting the first electrodes 48 and 50, having poor adhesion, to be in contact with the silicon oxide film constituting the interlayer dielectric film 52. Furthermore, since the aluminum, titanium or chromium constituting the second electrodes 49 and 51 exhibits high adhesion to the silicon oxide film, the interlayer dielectric film 52 is unlikely to peel off the second electrodes 49 and 51, and cracking is also unlikely to occur. Besides, in this structure, since there is no gap between the electrodes and the interlayer dielectric film, a problem such as absorption of water into this gap or a reduction in mechanical strength does not occur.

Fifth Embodiment

Figure 6:
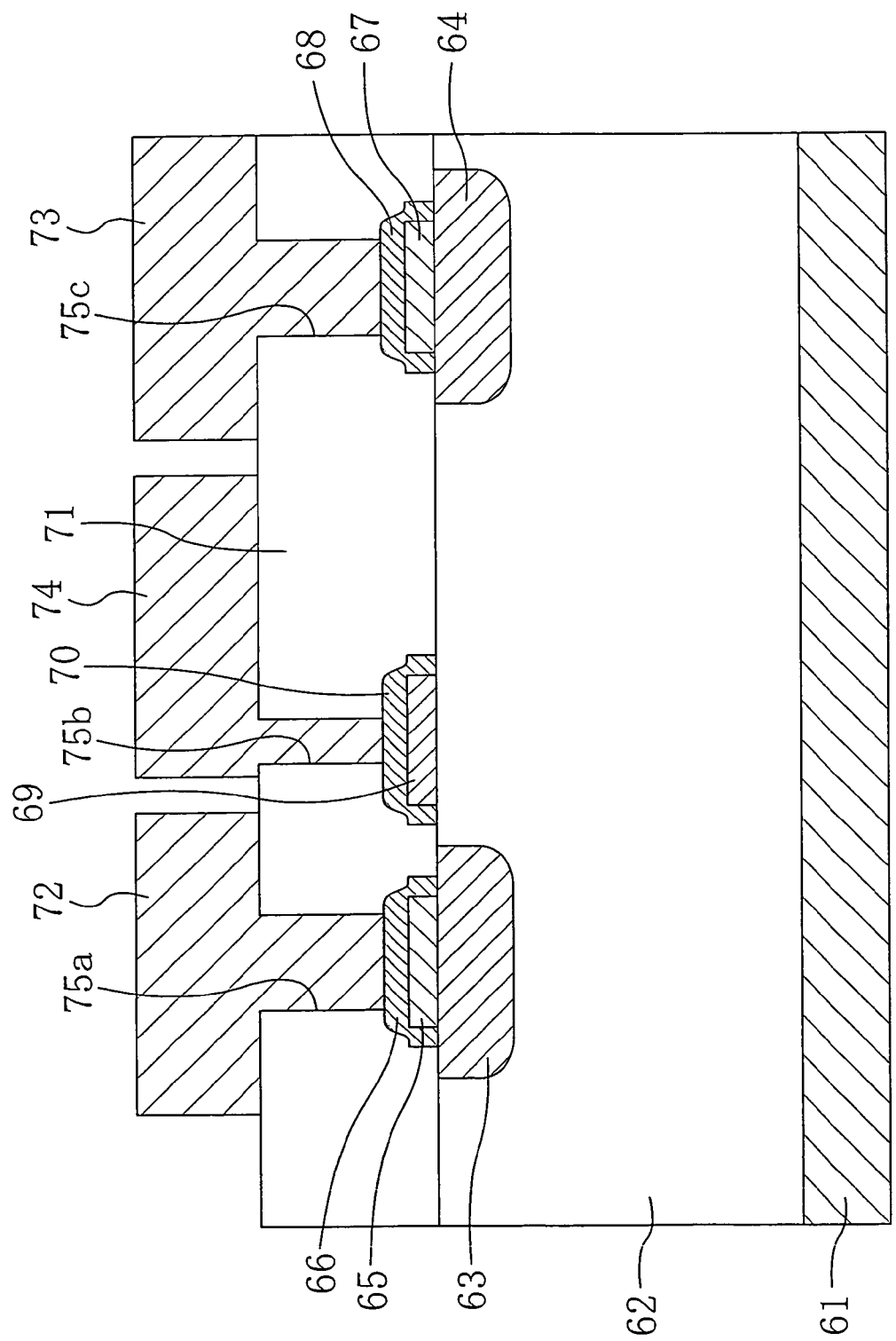
FIG. 6 is a cross-sectional view illustrating the structure of a MESFET according to a fifth embodiment of the present invention.

In the present embodiment, a MESFET will be described. FIG. 6 is a cross-sectional view illustrating the structure of a MESFET according to a fifth embodiment of the present invention.

As shown in FIG. 6, in the MESFET of the present embodiment, an n-type drift layer 62 having a carrier concentration of $1 \times 10^{15}$ cm⁻³ to $1 \times 10^{16}$ cm⁻³ and a thickness of 5 µm to 10 µm is provided on a low-resistance n-type 4H—SiC substrate 61 having a principal plane that is 8 degrees off from the (0001) plane.

In a surface region of the drift layer 62, source and drain regions 63 and 64, each having an n-type dopant concentration of $1 \times 10^{18}$ cm⁻³ and a depth of 0.3 µm, are provided so as to be separated from each other.

On a portion of the drift layer 62 located between the source and drain regions 63 and 64, a gate electrode 69 that is in Schottky contact with the drift layer 62, that is made of nickel, and that has a thickness of 200 nm is formed. Alternatively, titanium may be used as the gate electrode 69 instead of nickel. Suppose that an annealing is performed after a nickel film has been formed on silicon carbide. In that case, the silicon carbide becomes in ohmic contact with the nickel film. In the present embodiment, after an annealing for other electrodes or the like has been performed, the gate electrode 69 is formed, and thereafter no annealing is performed; thus, the Schottky contact is maintained.

On the source region 63, a first electrode 65 made of nickel and having a thickness of 100 nm is provided. Similarly, on the drain region 64, another first electrode 67 made of nickel and having a thickness of 100 nm is provided. In this embodiment, after the first electrodes 65 and 67 have been formed, a RTA process is performed at a temperature of about 1000° C., thereby allowing the first electrodes 65 and 67 to be in ohmic contact with the source and drain regions 63 and 64, respectively.

The first electrodes 65 and 67 and the gate electrode 69 are provided, at the top faces and side faces thereof, with second electrodes 66, 68 and 70, respectively. In this embodiment, the second electrodes 66, 68 and 70 do not have to completely cover the top faces of the first electrodes 65, 67 and the gate electrode 69. That is, it is sufficient that the second electrodes 66, 68 and 70 are interposed between the first electrodes 65 and 67 and gate electrode 69 and an interlayer dielectric film 71 made of silicon oxide so as not to allow the first electrodes 65 and 67 and gate electrode 69 to be in direct contact with the interlayer dielectric film 71.

As a material for the second electrodes 66, 68 and 70, a metal whose adhesion to the interlayer dielectric film 71 is good is selected. If the interlayer dielectric film 71 is made of silicon oxide as mentioned above, it is preferable to use aluminum, titanium or chromium as the second electrodes 66, 68 and 70. Even if other material is used as the second electrodes 66, 68 and 70, the effects of the present invention can be achieved as long as the adhesion of the material to the interlayer dielectric film 71 is higher than that of the first electrodes 65 and 67 and gate electrode 69 to the interlayer dielectric film 71.

The interlayer dielectric film 71 made of silicon oxide and having a thickness of 1.5 µm is provided over the drift layer 62 so as to cover the second electrodes 66, 68 and 70. The interlayer dielectric film 71 is provided with contact holes 75$a$, 75$b$ and 75$c$ that reach the second electrode 66, the gate electrode 70 and the second electrode 68, respectively. On the interlayer dielectric film 71, a source electrode pad 72, a gate electrode pad 74 and a drain electrode pad 73, each made of aluminum and having a thickness of 3 µm, are provided so as to fill the contact holes 75$a$, 75$b$ and 75$c$, respectively.

In the present embodiment, since the first electrodes 65 and 67 are made of nickel, the contact resistance between the first electrodes 65 and 67 and the source and drain regions 63 and 64 can be as low as $1 \times 10^{-5}$ Ω·cm² or less. At the same time, since the second electrodes 66 and 68 are interposed between the first electrodes 65 and 67 and the interlayer dielectric film 71, it becomes unnecessary to allow the nickel constituting the first electrodes 65 and 67, having poor adhesion, to be in contact with the silicon oxide film constituting the interlayer dielectric film 71. Furthermore, since the aluminum, titanium or chromium constituting the second electrodes 66 and 68 exhibits high adhesion to the silicon oxide film, the interlayer dielectric film 71 is unlikely to peel off the second electrodes 66 and 68, and cracking is also unlikely to occur. Besides, in this structure, since there is no gap between the second electrodes 66 and 68 and the interlayer dielectric film 71, a problem such as absorption of water into this gap or a reduction in mechanical strength does not occur.

Since it is unnecessary to allow the gate electrode 69 to be in ohmic contact with the drift layer 62, the gate electrode 69 does not have to be formed by a metal such as nickel whose adhesion to the interlayer dielectric film 71 is poor. However, if the gate electrode 69 is formed by other material whose adhesion to the interlayer dielectric film 71 is poor, the gate electrode 69 is covered with the second electrode 70, thus preventing the interlayer dielectric film 71 from peeling off.

Sixth Embodiment

Figure 7:
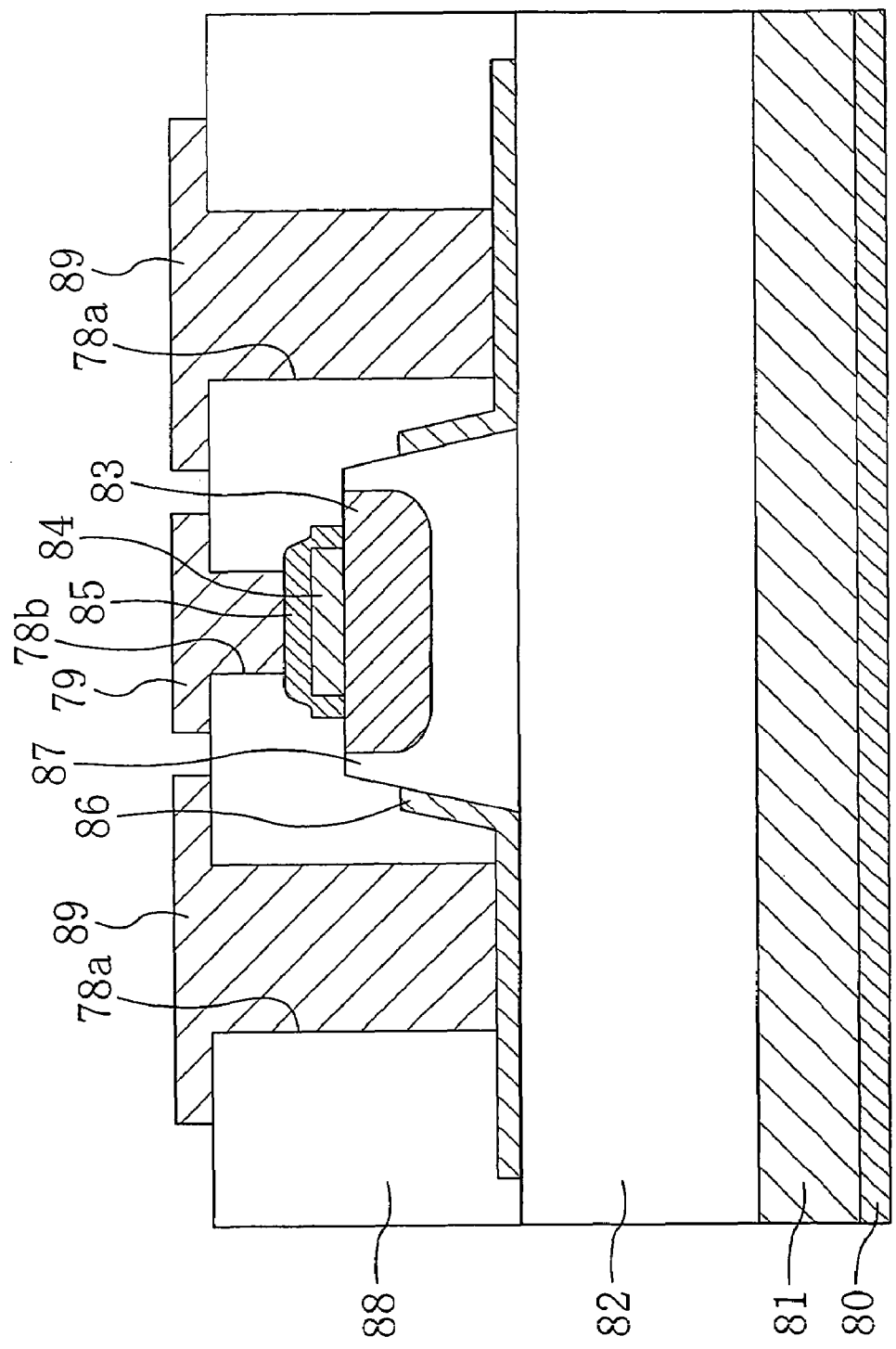
FIG. 7 is a cross-sectional view illustrating the structure of a static induction transistor according to a sixth embodiment of the present invention.

In the present embodiment, a static induction transistor will be described. FIG. 7 is a cross-sectional view illustrating the structure of a static induction transistor according to a sixth embodiment of the present invention.

As shown in FIG. 7, in the static induction transistor of the present embodiment, a drift layer 82 made of n-type SiC is formed on a low-resistance n-type 4H—SiC substrate 81 having a principal plane that is 8 degrees off from the (0001) plane. For example, in the case of the static induction transistor that withstands 600 V, the drift layer 82 has a carrier concentration of $1\times10^{15}$ $cm^{-3}$ to $1\times10^{16}$ $cm^{-3}$. The drift layer 82 is partially etched by a RIE process or the like so that the drift layer 82 is provided with a mesa 87. The thickness of the drift layer 82 is 6 μm to 20 μm at the mesa 87, and portions of the drift layer 82 located on both sides of the mesa 87 are each etched to a depth of several μm.

In a surface region of the drift layer 82 at the mesa 87, a source region 83 having an n-type dopant concentration of $1\times10^{18}$ $cm^{-3}$ and a depth of 0.3 μm is provided. On the surface of the source region 83, a first source electrode 84 made of nickel and having a thickness of 100 nm is provided. After the first source electrode 84 has been formed, a RTA process is performed at a temperature of about 1000° C., thereby allowing the source region 83 to be in ohmic contact with the first source electrode 84. On the top face and side faces of the first source electrode 84, a second source electrode 85 having a thickness of 150 nm is provided. In this embodiment, the second source electrode 85 does not have to completely cover the top face of the first source electrode 84. That is, it is sufficient that the second source electrode 85 is interposed between the first source electrode 84 and an interlayer dielectric film 88 made of silicon oxide so as not to allow the first source electrode 84 to be in direct contact with the interlayer dielectric film 88.

As a material for the second source electrode 85, a metal whose adhesion to the interlayer dielectric film 88 is good is selected. If the interlayer dielectric film 88 is made of silicon oxide as mentioned above, it is preferable to use aluminum, titanium or chromium as the second source electrode 85. Even if other material is used as the second source electrode 85, the effects of the present invention can be achieved as long as the adhesion of the material to the interlayer dielectric film 88 is higher than that of the first source electrode 84 to the interlayer dielectric film 88.

On sidewall regions of the mesa 87 of the drift layer 82 and on planar regions of the drift layer 82 located on both sides of the mesa 87, gate electrodes 86 each made of titanium and having a thickness of 200 nm are provided. The gate electrodes 86 are in Schottky contact with the drift layer 82. If titanium is used as the gate electrodes 86, the gate electrodes 86 can easily be in Schottky contact with the drift layer 82, and the adhesion of the gate electrodes 86 to the interlayer dielectric film 88 made of silicon oxide can also be improved. Alternatively, in the present embodiment, nickel may be used as the gate electrodes 86 instead of titanium.

The interlayer dielectric film 88, made of silicon oxide and having a thickness of 1.5 μm, is provided over the drift layer 82 so as to cover the second source electrode 85 and the gate electrodes 86. The interlayer dielectric film 88 is provided with contact holes 78a and 78b that reach the gate electrodes 86 and the second source electrode 85, respectively. On the interlayer dielectric film 88, source electrode pads 89 and a gate electrode pad 79, each made of aluminum and having a thickness of 3 μm, are provided so as to fill the contact holes 78a and 78b, respectively.

On the back side of the substrate 81, a drain electrode 80 made of nickel and having a thickness of 200 nm is provided. In this embodiment, after the drain electrode 80 has been formed, a RTA process is performed at a temperature of about 1000° C., thereby allowing the substrate 81 to be in ohmic contact with the drain electrode 80.

In the present embodiment, since the first source electrode 84 is made of nickel, the contact resistance between the first source electrode 84 and the source region 83 can be as low as $1\times10^{-5}$ $\Omega \cdot cm^2$ or less. At the same time, since the second source electrode 85 is interposed between the first source electrode 84 and the interlayer dielectric film 88, it becomes unnecessary to allow the nickel constituting the first source electrode 84, having poor adhesion, to be in contact with the silicon oxide film constituting the interlayer dielectric film 88. Furthermore, since the aluminum, titanium or chromium constituting the second source electrode 85 exhibits high adhesion to the silicon oxide film, the interlayer dielectric film 88 is unlikely to peel off the second source electrode 85, and cracking is also unlikely to occur. Besides, in this structure, since there is no gap between the second source electrode 85 and the interlayer dielectric film 88, a problem such as absorption of water into this gap or a reduction in mechanical strength does not occur.

Seventh Embodiment

Figure 8:
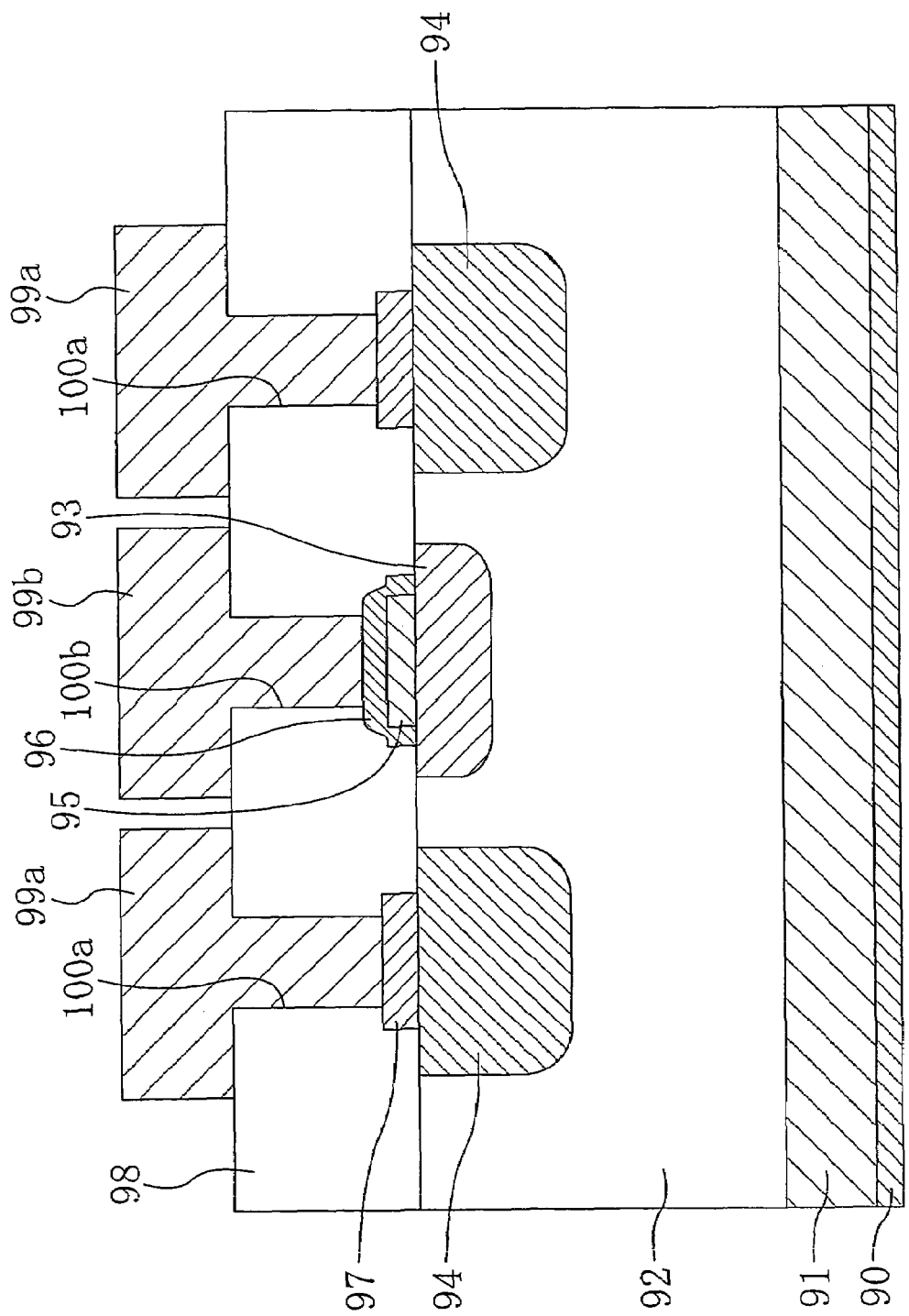
FIG. 8 is a cross-sectional view illustrating the structure of a JFET according to a seventh embodiment of the present invention.
Figure 9:
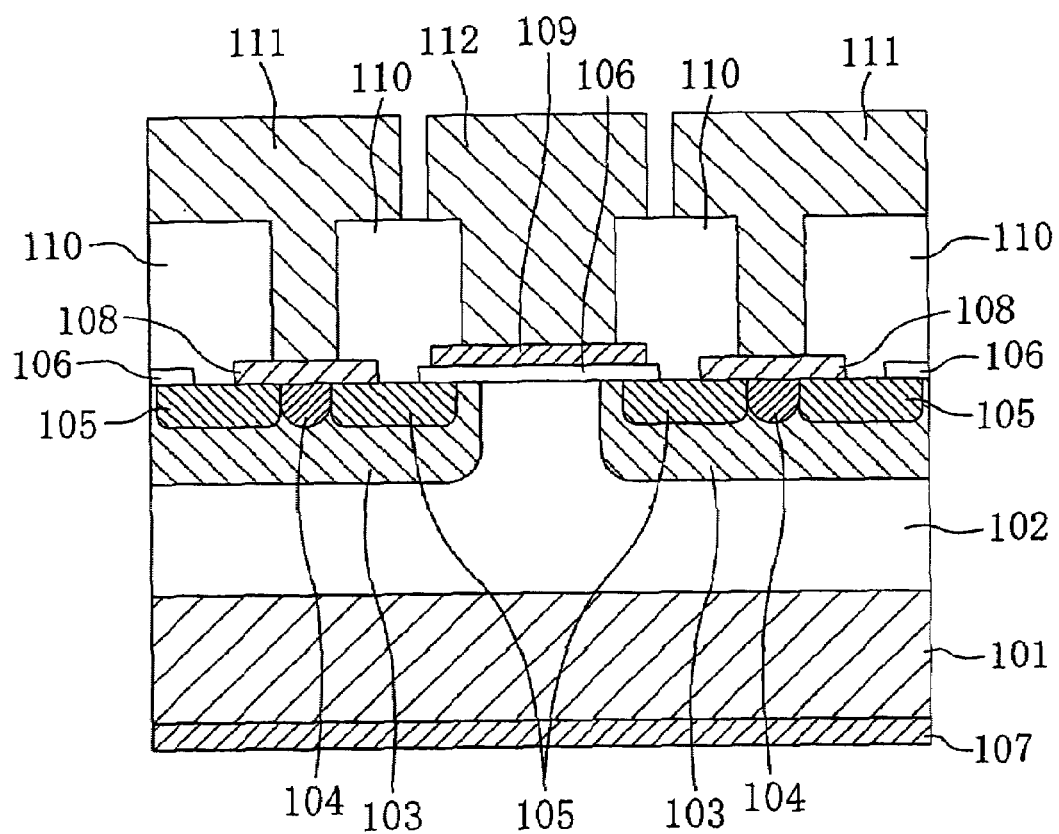
FIG. 9 is a cross-sectional view illustrating the structure of a double implantation MOSFET as an example of a conventional silicon carbide semiconductor device.

In the present embodiment, a JFET will be described. FIG. 8 is a cross-sectional view illustrating the structure of a JFET according to a seventh embodiment of the present invention.

As shown in FIG. 8, in the JFET of the present embodiment, a drift layer 92 having a carrier concentration of $1\times10^{15}$ $cm^{-3}$ to $1\times10^{16}$ $cm^{-3}$ and a thickness of 6 μm to 20 μm is provided on a low-resistance n-type 4H—SiC substrate 91 having a principal plane that is 8 degrees off from the (0001) plane.

In a surface region of the drift layer 92, a source region 93 having an n-type dopant concentration of $1\times10^{18}$ $cm^{-3}$ or more and a depth of 0.1 μm is formed.

In another surface regions of the drift layer 92 located on both sides of the source region 93, p-type gate regions 94, each having a carrier concentration of $1\times10^{18}$ $cm^{-3}$ to $1\times10^{19}$ $cm^{-3}$ and a depth of 0.3 μm, are provided so as to be separated from the source region 93.

On the source region 93, a first electrode 95 made of nickel and having a thickness of 100 nm is provided. In this embodiment, after the first electrode 95 has been formed, an annealing is performed at a temperature of about 1000° C., thereby allowing the source region 93 to be in ohmic contact with the first electrode 95. On the top face and side faces of the first electrode 95, a second electrode 96 made of aluminum and having a thickness of 150 nm is provided. In this embodiment, the second electrode 96 does not have to completely cover the top face of the first electrode 95. That is, it is sufficient that the second electrode 96 is interposed between the first electrode 95 and an interlayer dielectric film 98 made of silicon oxide so as not to allow the first electrode 95 to be in direct contact with the interlayer dielectric film 98.

As a material for the second electrode 96, a metal whose adhesion to the interlayer dielectric film 98 is good is selected. If the interlayer dielectric film 98 is made of silicon oxide as mentioned above, it is preferable to use aluminum, titanium or chromium as the second electrode 96. Even if other material is used as the second electrode 96, the effects of the present invention can be achieved as long as the adhesion of the material to the interlayer dielectric film 98 is higher than that of the first electrode 95 to the interlayer dielectric film 98.

On the gate regions 94, gate electrodes 97, each made of aluminum and having a thickness of 100 nm, are provided. If aluminum is used as the material for the gate electrodes 97, the gate electrodes 97 can easily be in ohmic contact with the p-type gate regions 94. Furthermore, after the gate electrodes 97 have been formed, a RTA process is performed at a temperature of about 1000° C., thereby allowing the gate electrodes 97 to be in ohmic contact with the gate regions 94.

The interlayer dielectric film 98, made of silicon oxide and having a thickness of 1.5 µm, is provided over the drift layer 92 so as to cover the second electrode 96 and the gate electrodes 97.

The interlayer dielectric film 98 is provided with contact holes 100a and 100b that reach the gate electrodes 97 and the second electrode 96, respectively. On the interlayer dielectric film 98, source electrode pads 99a and a gate electrode pad 99b, each made of aluminum and having a thickness of 3 µm, are provided so as to fill the contact holes 100a and 100b, respectively. The thicknesses of the gate electrode pad 99b, the source electrode pads 99a and the interlayer dielectric film 98 are preferably each set at a value that prevents the JFET from being damaged by the impact during wire bonding.

On the back side of the substrate 91, a drain electrode 90 made of nickel and having a thickness of 200 nm is provided. In this embodiment, after the drain electrode 90 has been formed, a RTA process is performed at a temperature of about 1000° C., thus making it possible to form ohmic junction between the drain electrode 90 and the substrate 91.

In the present embodiment, since the first electrode 95 is made of nickel, the contact resistance between the first electrode 95 and the source region 93 can be as low as $1 \times 10^{-5}$ $\Omega \cdot cm^2$ or less. At the same time, since the second electrode 96 is interposed between the first electrode 95 and the interlayer dielectric film 98, it becomes unnecessary to allow the nickel constituting the first electrode 95, having poor adhesion, to be in contact with the silicon oxide film constituting the interlayer dielectric film 98. Furthermore, since the aluminum, titanium or chromium constituting the second electrode 96 exhibits high adhesion to the silicon oxide film, the interlayer dielectric film 98 is unlikely to peel off the second electrode 96, and cracking is also unlikely to occur. Besides, in this structure, since there is no gap between the second electrode 96 and the interlayer dielectric film 98, a problem such as absorption of water into this gap or a reduction in mechanical strength does not occur.

What is claimed is:

1. A silicon carbide semiconductor device comprising:
a semiconductor layer made of silicon carbide;
an electrode provided on the semiconductor layer;
an interlayer dielectric film provided on the electrode; and
an interconnect that passes through the interlayer dielectric film and reaches the electrode,
wherein the electrode comprises: a first electrode portion in contact with the semiconductor layer; and a second electrode portion interposed between the first electrode portion and the interlayer dielectric film so as not to allow the first electrode portion to be in direct contact with the interlayer dielectric film, and
the second electrode portion is made of a material whose adhesion to the interlayer dielectric film is higher than an adhesion of a material of the first electrode portion to the interlayer dielectric film,
wherein the second electrode portion covers all side faces of the first electrode portion;
wherein the first electrode portion comprises Ni; and
wherein the electrode is a source electrode.

2. The silicon carbide semiconductor device of claim 1, wherein the second electrode portion covers the top face of the first electrode portion.

3. The silicon carbide semiconductor device of claim 1 wherein the first electrode portion is in ohmic contact with the semiconductor layer.

4. The silicon carbide semiconductor device of claim 1, wherein the second electrode portion comprises at least one of Al, Ti and Cr.

5. The silicon carbide semiconductor device of any one of claims 1-3 and 4, wherein the interlayer dielectric film is made of silicon oxide.

6. The silicon carbide semiconductor device of claim 1, wherein a gate electrode is provided over the semiconductor layer.

7. The silicon carbide semiconductor device of claim 6, wherein the second electrode portion is made of the same material as the gate electrode.

8. The silicon carbide semiconductor device of claim 6, wherein the semiconductor layer is a high resistance layer comprising a dopant of a first conductivity type,
wherein the semiconductor device further comprises:
a semiconductor substrate that is provided on the back side of the semiconductor layer and has a first conductivity type dopant concentration higher than that of the semiconductor layer;
a plurality of well regions each provided in an upper portion of the high resistance layer and comprising a dopant of a second conductivity type;
a contact region of the second conductivity type provided in an upper portion of each well region;
a source region of the first conductivity type provided in an upper portion of each of the plurality of well regions, the upper portion being located to laterally surround the contact region;
a gate insulating film provided on a portion of the high resistance layer located between the plurality of well regions; and
a drain electrode provided on the back side of the semiconductor substrate, wherein the source electrode is provided on the contact region and on a part of the source region adjacent thereto, and wherein the gate electrode is provided on the gate insulating film.

9. The silicon carbide semiconductor device of claim 8, wherein the high resistance layer is further provided, at its upper portion, with an accumulation channel layer, and wherein the gate insulating film is provided on the accumulation channel layer.

10. The silicon carbide semiconductor device of claim 6, wherein the semiconductor layer is a base layer comprising a dopant of a second conductivity type, wherein the semiconductor device further comprises:

a drift layer that is provided on the back side of the semiconductor layer and comprises a dopant of a first conductivity type;

a semiconductor substrate provided on the back side of the drift layer;

a trench that passes through the base layer and reaches the drift layer;

a gate insulating film provided on the side faces of the trench;

a contact region of the second conductivity type provided in an upper portion of the base layer;

a source region provided in an upper portion of the base layer located to laterally surround the contact region; and a drain electrode provided on the back side of the semiconductor substrate, wherein the source electrode is provided on the contact region and on a part of the source region adjacent thereto, and wherein the gate electrode is provided on the gate insulating film.

11. The silicon carbide semiconductor device of claim 6, wherein the semiconductor layer is a base layer comprising a dopant of a second conductivity type, wherein the semiconductor device further comprises:

a semiconductor substrate provided on the back side of the base layer;

source and drain regions of a first conductivity type provided in upper portions of the base layer so as to be separated from each other; and a gate insulating film provided on a portion of the base layer located between the source region and the drain region, wherein the source electrode is provided on the source region or a drain electrode provided on the drain region, and wherein the gate electrode is provided on the gate insulating film.

12. The silicon carbide semiconductor device of claim 6, wherein the semiconductor layer is a drift layer comprising a dopant of a first conductivity type, wherein the semiconductor device further comprises:

a semiconductor substrate provided on the back side of the drift layer; and source and drain regions of the first conductivity type provided in upper portions of the drift layer so as to be separated from each other, wherein the source electrode is provided on the source region or a drain electrode provided on the drain region, and wherein the gate electrode is provided on a portion of the drift layer located between the source region and the drain region.

13. The silicon carbide semiconductor device of claim 6, wherein the semiconductor layer is a drift layer that comprises a dopant of a first conductivity type and has a mesa, wherein the semiconductor device further comprises:

a semiconductor substrate provided on the back side of the drift layer; and a source region of the first conductivity type provided in an upper portion of the mesa of the drift layer, wherein the source electrode that is provided on the top face of the mesa of the drift layer so as to be in contact with the source region, and wherein the gate electrode is provided on each side face of the mesa of the drift layer and on a part of the drift layer located on each side of the mesa.

14. The silicon carbide semiconductor device of claim 6, wherein the semiconductor layer is a drift layer comprising a dopant of a first conductivity type, wherein the semiconductor device further comprises:

a semiconductor substrate provided on the back side of the drift layer;

a source region of the first conductivity type provided in an upper portion of the drift layer; and gate regions of a second conductivity type provided in upper portions of the drift layer located on both sides of the source region so that the gate regions are separated from the source region, wherein the source electrode is provided on the source region, and wherein the gate electrode is provided on each of the gate regions.

* * * * *